US006433844B2

United States Patent
Li

(10) Patent No.: US 6,433,844 B2
(45) Date of Patent: *Aug. 13, 2002

(54) METHOD FOR CREATING A COLOR MICROLENS ARRAY OF A COLOR DISPLAY LAYER

(75) Inventor: Zong-Fu Li, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/902,012

(22) Filed: Jul. 9, 2001

Related U.S. Application Data

(62) Division of application No. 09/052,609, filed on Mar. 31, 1998, now Pat. No. 6,271,900.

(51) Int. Cl.⁷ .............................................. G02F 1/1335
(52) U.S. Cl. ............................................. 349/95; 438/30
(58) Field of Search ..................... 349/95, 106; 438/65, 438/30, 29, 70, 69; 430/321, 330, 394; 427/162; 257/244; 216/26

(56) References Cited

U.S. PATENT DOCUMENTS

| | | | |
|---|---|---|---|
| 4,776,675 A | | 10/1988 | Takaochi et al. |
| 5,238,856 A | * | 8/1993 | Tokumitsu .................... 438/69 |
| 5,324,623 A | | 6/1994 | Tsumori |
| 5,418,635 A | | 5/1995 | Mitsui et al. |
| 5,466,926 A | | 11/1995 | Sasano et al. |
| 5,470,760 A | | 11/1995 | Nakai |
| 5,677,200 A | | 10/1997 | Park et al. |
| 5,682,215 A | | 10/1997 | Nishihara et al. |
| 5,718,830 A | | 2/1998 | Hlinka et al. |
| 5,723,264 A | | 3/1998 | Robello et al. |
| 5,739,548 A | | 4/1998 | Shigeta et al. |
| 5,766,980 A | | 6/1998 | Ohtagaki et al. |
| 5,886,760 A | | 3/1999 | Ueda et al. |
| 5,948,281 A | | 9/1999 | Okazaki et al. |
| 6,078,372 A | * | 6/2000 | Kim ........................... 349/106 |
| 6,171,833 B1 | | 1/2001 | Sinskey et al. |
| 6,271,900 B1 | * | 8/2001 | Li ............................... 349/95 |
| 6,297,911 B1 | * | 10/2001 | Nishikawa et al. ......... 359/619 |
| 6,323,920 B1 | * | 11/2001 | Kim ........................... 349/106 |

* cited by examiner

*Primary Examiner*—Kenneth Parker
(74) *Attorney, Agent, or Firm*—Blakely, Sokoloff, Taylor & Zafman LLP

(57) ABSTRACT

The making and use of color microlenses in color image sensors and color display devices is described and claimed. The color microlenses combine the function of a colorless microlens and a color filter into a single structure simplifying the fabrication of, and increasing the reliability of display devices and image sensors using the described color microlenses.

7 Claims, 3 Drawing Sheets

METHOD FOR CREATING A COLOR MICROLENS ARRAY OF A COLOR DISPLAY LAYER

This application is a divisional of and takes the benefit of the earlier filing date of U.S. patent application Ser. No. 09/052,609 filed Mar. 31, 1998 is now U.S. Pat. No. 6,271,900.

FIELD

The present invention relates to the field of image sensors and display devices.

GENERAL BACKGROUND

Microlenses have long been used in imaging devices to focus light on sensors including charge couple device (CCD) sensors and complementary metal oxide semiconductor (CMOS) sensors. The microlenses significantly improve the light sensitivity of the imaging device by collecting light from a large light collecting area and focusing it on a small light sensitive area of the sensor. The ratio of the overall light collecting area of a sensor to the light sensitive area of the sensor is defined to be a fill factor. Typical fill factors in prior art designs are less than 50%.

One prior art method of generating a color image signal is shown in FIG. 1A. Light from a subject to be imaged comes in as light rays 104 and passes through a set of microlenses 108, 112, 116. The microlenses are formed on a planarization layer 120. After passing through the planarization layer 120, the light 104 is filtered by color filters 124, 128, 132 which together form a color filter array. Each color filter 124, 128, 132 in the color filter array only allows light of a specific color to pass through. A "color" is defined to be light having a specific range of frequencies. Typical color filters 124, 128, 132 used in the color filter array are red, green and blue filters (RGB) or cyan, magenta and yellow (CMY) filters. Each microlens and color filter combination corresponds to a sensor 136, 140, 144. Each sensor is a light sensitive device capable of converting the intensity of light striking the sensor 136, 140, 144 into an electrical signal. A microlens, color filter, and sensors such as sensors 136, 140, 144 correspond to a pixel of an image. The sensors 136, 140, 144 are in close proximity to each other, and each sensor receives filtered light from a corresponding color filter 124, 128, 132. By combining the output of the sensors 136, 140, 144, a processor, such as a graphics processor, can determine the approximate intensity and color of light striking the area in the proximity of sensor 136, 140, 144. By creating an array of such sensors (red sensor 160, blue sensor 164, green sensor 168) as shown in FIG. 1B, an overall color image can be reconstructed.

The fabrication of separate microlenses, color filters, and image sensors in the structure illustrated in FIGS. 1A and 1B has several disadvantages. For example, one disadvantage of the traditional structure is that many process steps are needed to form a first layer 148 including the sensors 136, 140, 144; a second layer 152 including the color filters 124, 128, 132, and a third planarization layer 156 to support microlenses 108, 112, 116.

Another disadvantage of the current structure is that the microlenses 108, 112, 116 are separated from the corresponding image sensors 136, 140, 144 by the planarization layer 156 and the color filter layer 152. The separation reduces the light reaching the sensors 136, 140, 144 because some light is absorbed passing through the multiple layers 152, 156. Furthermore, the separation results in increased crosstalk between pixels. "Crosstalk" results when off axis light strikes a microlens such as microlens 112 at an obtuse angle of incidence. The off-axis light passes through planarization layers 156 and a color filter 128 missing the sensor 140 which corresponds to the color filter 128 and instead striking an adjacent sensor 136. Alternately, the off-axis light coming in through microlens 112 may pass between filters 124 and 128 and reach adjacent sensor 136 resulting in an erroneous readings from the image sensor 136.

Additional disadvantages of the currect micro-lens filter combinations include the additional process steps being used to fabricate the multi-level structure of FIG. 1, the decreased reliability resulting from separation of layers 148, 152, 156 and the increased material costs used to fabricate separate transparent microlenses 108, 112, 116, color filters 124, 128, 132, and associated planarization layer 156.

A second use of the microlens, color filter layer, structure is in color display devices. FIG. 2 illustrates an example of using the microlens color filter structure in a thin film transfer (TFT) liquid crystal display device. In FIG. 2, light from a backlight or other light source 204 passes through a color filter layer 208 containing color filters 212, 216 and 220. The color filters 212, 216, 220 are typically different colors allowing only one color of light to pass through each filter. Microlenses 224, 228 and 232 in microlens layer 236 focuses the light from corresponding color filters 212, 216, 220 through a substrate 240 and a liquid crystal display (LCD) layer 244 to a TFT substrate 248. Each TFT switch 252, 256, 260 corresponds to a corresponding color filter 212, 216, 220. By controlling the amount of light passing through each switch 252, 256, 260, the output of each color filter 212, 216, 220 can be controlled. Combining the outputs of the color filters and TFT switches generates the output of a pixel of the color display device.

Display devices formed using the described techniques suffer from the previously described disadvantages including (1) difficulty in fabrication; (2) crosstalk between filters and switches caused by the increased separation generated by the microlens layer; and (3) problems with device reliability resulting from adhesion between multiple layers and increased material costs resulting from the necessity for multiple layers.

Thus an improved method for forming microlens and color filter structures is desired.

SUMMARY

The present invention describes a method of forming a color microlens array on a semiconductor substrate. The method involves depositing a colored microlens resist on a semiconductor surface. The colored microlens resist is patterned and then baked to cause flowing of the colored microlens resist resulting in a color microlens with a curved surface.

DETAILED DESCRIPTION

In the following description, an array of colored microlenses will be described. In the embodiment, the colored microlenses are formed over a planar substrate using semiconductor processing techniques, including photolithography and baking of a microlens resist. Combining the function of a microlens and a color filter into a single colored microlens reduces the number of components and number of operations used to fabricate color display and image acquisition devices. Reducing the number of components also increases device reliability. Examples of devices which utilize color microlenses include, but are not limited to, colored imaging displays, such as TFT displays, for example, and image acquisition devices such as charge coupled device (CCD) digital cameras.

In the accompanying description, certain details will be provided to facilitate understanding of the invention. For example, certain processes used to form the color microlenses are described. However it is recognized that other methods of fabricating a color microlens may be appropriate. The included details are provided to facilitate understanding of the invention and should not be interpreted to limit the scope of the invention. Certain details will be omitted because such detail would obscure the invention and are already well understood by those of ordinary skill in the art.

Figure 1A:
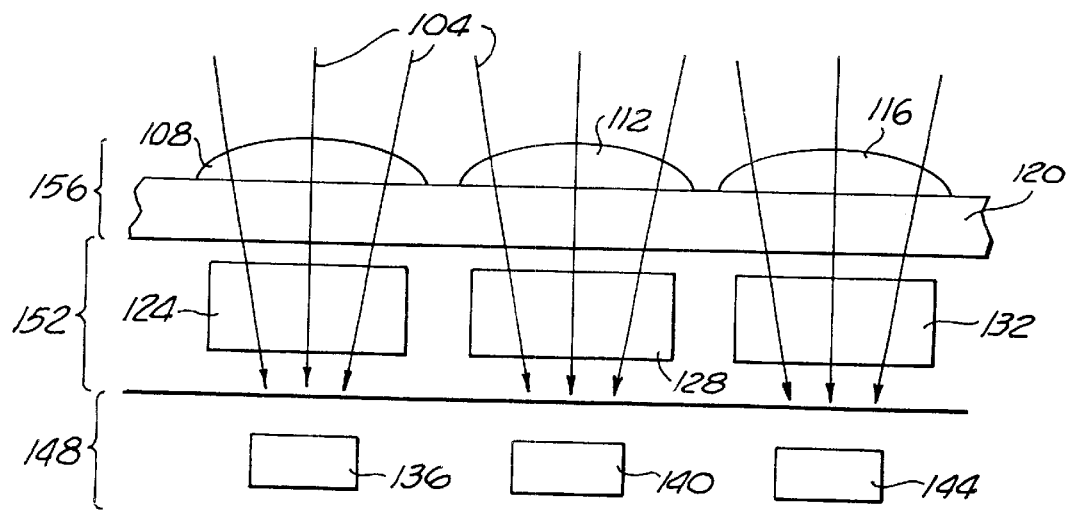
FIG. 1A is a cross section drawing of a conventional color filter array structure for acquiring color images.
Figure 1B:
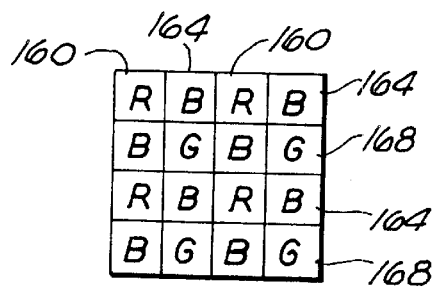
FIG. 1B illustrates an example of an arrangement of color filters in a detection device.
Figure 2:
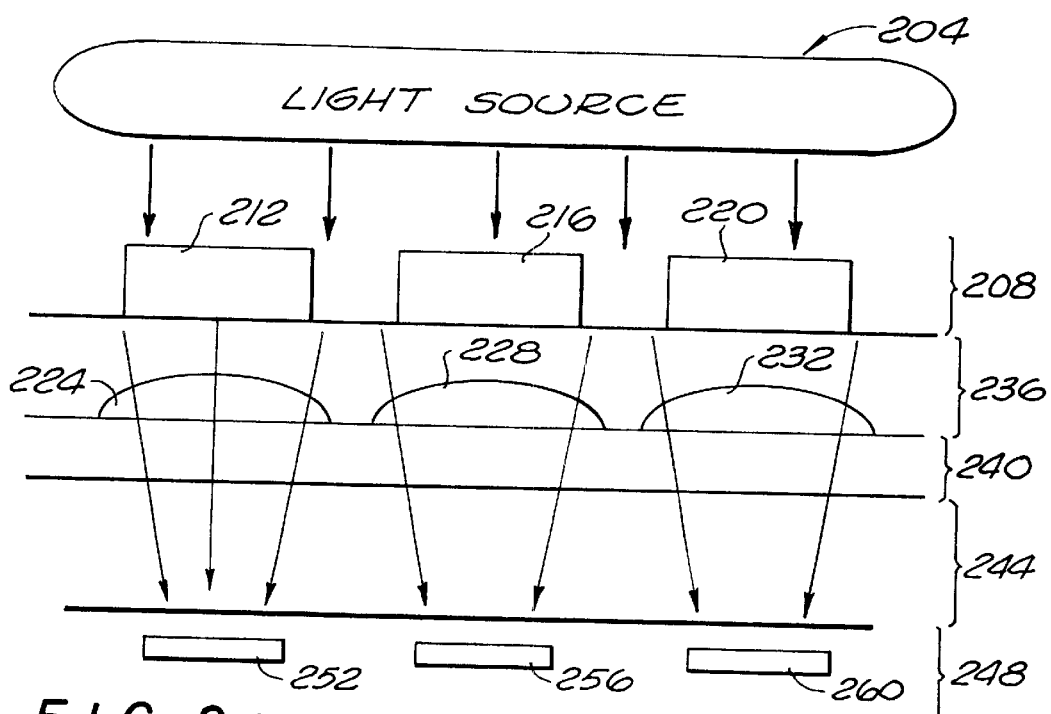
FIG. 2 is a cross section of a thin film transfer (TFT) based liquid crystal display utilizing a microlens system.
Figure 3:
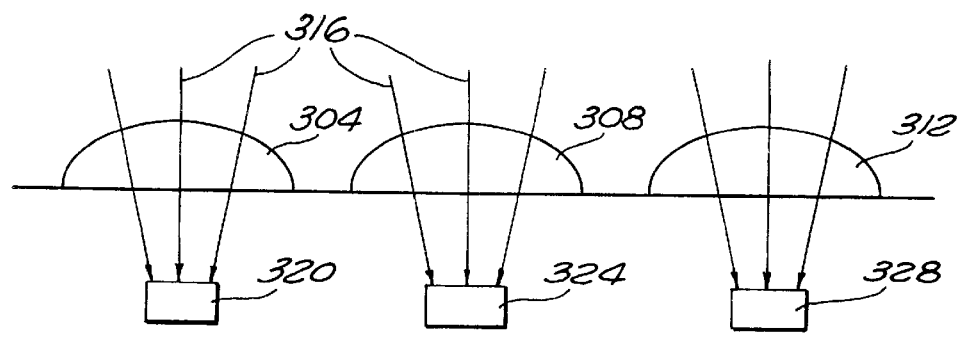
FIG. 3 illustrates a cross section of a color imaging device for acquiring color images utilizing a colored microlens array which combines microlenses and color filters.

FIG. 3 illustrates a set of microlenses 304, 308, 312 for use in a color imaging device. Light rays 316 from an external source passes through the colored microlenses 304, 308, 312 and are incident upon a set of sensors 320, 324 and 328. Each microlens 304, 308, 312 in the set typically allows a different color of light to pass through. Thus, in one embodiment, one microlens may be red, another blue and a third microlens green. Together, the set of three microlenses detect light corresponding to a pixel of an image. In this embodiment, the three microlenses 304, 308, 312 are located in close proximity to each other (typically within one micron), each microlens 304, 205, 312 positioned to allow one color of light to reach the sensor 320, 324, 328 corresponding to the microlens 304, 308, 342 respectively. A processor or other appropriate graphic circuitry can combine the output of the three sensors 320, 324, 328 to determine a color and intensity of light striking the general region around the three sensors 320, 324, 328. In an image, the general region corresponds to a pixel. To improve resolution, pixels should be small and, thus, the microlenses should be small. The diameter of microlens ranges in size from 8 microns to 15 microns for different devices.

Figure 4:
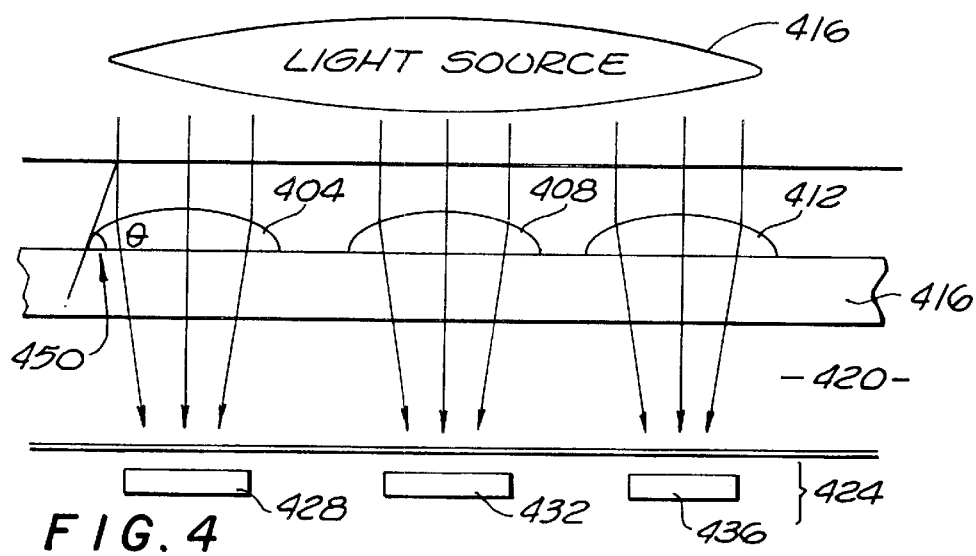
FIG. 4 is a cross section of a TFT liquid crystal display utilizing the color microlenses of the present invention.

FIG. 4 illustrates the use of color microlenses 404, 408, 412 in a color display device. A light source 416 provides illumination which passes through microlenses 404, 408, 412 through a counter substrate layer 416 and to a liquid crystal display (LCD) layer 420. Each microlens of a set filters a different color, as well as focuses light from the light source 416 to a particular region of the LCD crystal layer 420 being switched. The crystals in the LCD under each color microlens act as a switch and filters that light. An applied electric potential determines when light can pass through the liquid crystal in the region underneath the microlens or when light is blocked from passing through the LCD layer 420. Electrodes residing on both sides of the LCD layer 420 are used to apply the electric potential.

In another embodiment, a thin film transfer (TFT) switch 428, 432, 436 may be used to switch the crystals in the LCD layer 420. The three microlenses 404, 408, 412 form a set corresponding to a color display device pixel. Thus, it is desired, but not required, that the microlenses 404, 408 and 412 have small dimensions, each microlens typically less than 10 microns in diameter by 3 microns in height so that they can be placed in close proximity. A human eye receives the output of the display device and merges the microlens outputs for a pixel to generate the actual color which is intended to be displayed.

Figure 5:
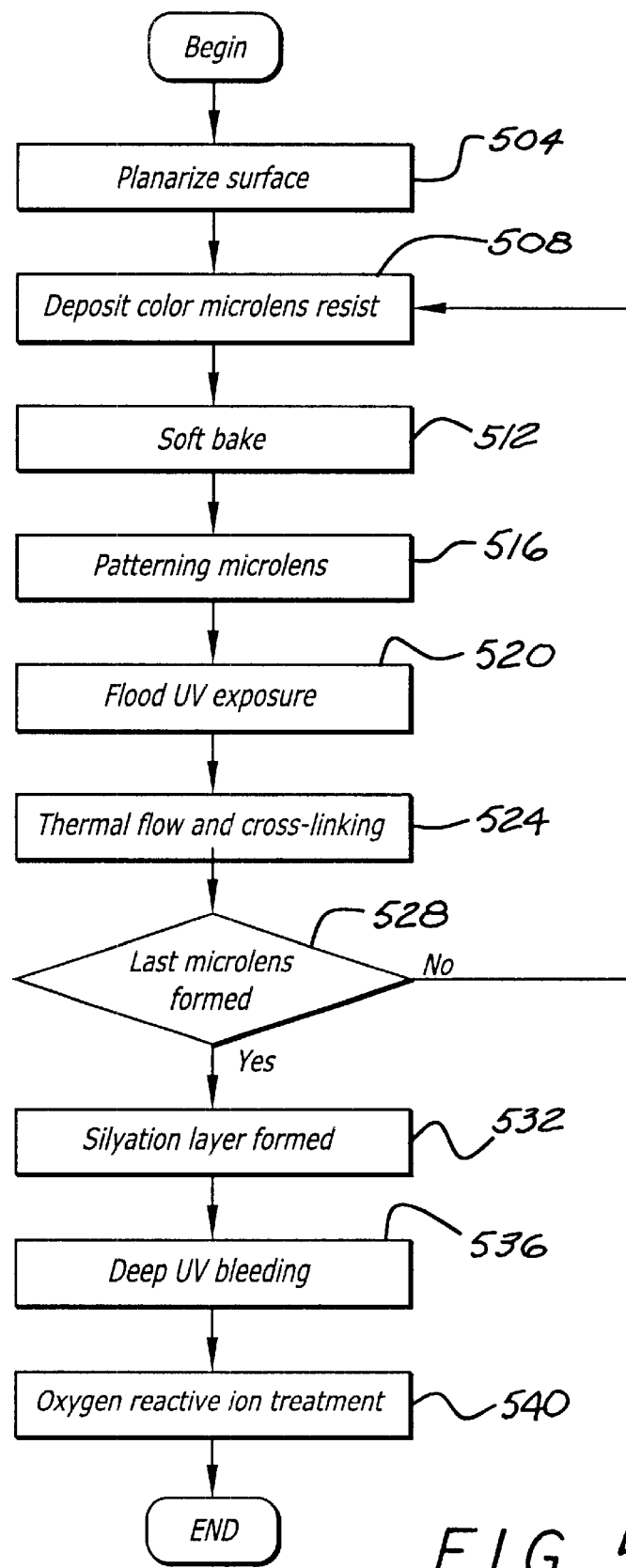
FIG. 5 shows the processes used in fabricating a colored microlens.

FIG. 5 is a flow diagram illustrating a lithographic method of fabricating color microlenses. In block 504 the surface of the semiconductor substrate upon which the microlenses will be formed is planarized. Planarization provides a flat and smooth substrate surface upon which a microlens resist can be deposited. In some embodiments, when a surface is already polished and smooth, planarization may be unnecessary. One method of planarization involves spin coating a planarization layer which is subsequently baked. The materials used in the spin coated planarization layer can be classified into either non-photo-definable and photo-definable materials. "Non-photo-definable" materials (non-photo-sensitive materials) include acrylics and polyorganosiloxiane, for example. Examples of "photo-definable" materials (photo-sensitive materials) include acrylic based resists and epoxy based resists. In this embodiment, photo-definable planarization is used because non-photo-definable planarization often requires an extra photolithographic patterning operation to open areas of bond pads, while photo-definable planarization layers can be patterned directly and etched.

In block 508, a color microlens resist material is deposited on the planarized surface. In one embodiment, deposition of the color microlens resist is achieved by spin coating a planarized layer with the color microlens resist. The thickness of the coating is determined by the required thickness of the microlens. The thickness of the microlens resist is a function of the focal length requirements of the microlens, a shorter focal length requires a thicker lens, and thus, a thicker microlens resist layer. The focal length of the microlens should be designed to effectively focus light on the corresponding sensor. The microlens thickness (t) vs. focus length (f) may be estimated according to the following relationship:

$$f = \left(\frac{3At}{\pi(2 - \cos\Theta + \cos^3\Theta)}\right)^{\frac{1}{3}} \left(\frac{n_1}{n_1 - n_o}\right)$$

where:

A: Area of microlens $\Theta$: Contact angle between microlens and supporting substrate $n_1$: refractive index of microlens $n_0$: refractive index of air The "contact angle" is a function of the microlens curvature and can be computed as the angle between a first line tangent to the microlens surface at a point on the microlens near the interface between the microlens and the support substrate and a second line parallel to the support substrate surface. The contact angle is illustrated as angle $\Theta$ 450 of FIG. 4.

The thickness and shape of the color microlens may be computed using ray tracing programs and is also dependent on the index of refraction of the microlens resist material. Different colored microlenses may contain different pigments having different indexes of refraction. Thus different microlenses in a set may have different dimensions. In typical sensor applications for which the pixel sizes are around 10 microns by 10 microns, the thickness of the microlens can vary from 2 to 4 microns depending on the index of refraction of the microlens material, the distance of the microlens from the sensor, and the area of the sensor. The determination of lens shapes is well understood in the art and can be computed via commercially available rate tracing programs.

In block 512, the microlens resist is baked at a relatively low temperature known as a "soft bake". In a positive resist, the soft bake process involves baking the microlens resist at a temperature of about 100° Celsius (C.) for a time of approximately one minute. After the soft bake, a patterning process is performed in which the microlens resist is typically exposed to ultraviolet (UV) light in a photolithographic process in block 516. In one embodiment the UV light has a wavelength or I-line of approximately 365 nanometers and dose of 100 Millijoules/cm$^2$. After exposure to the UV light, the microlens resist is developed in a developer solution.

After the patterning block 516, the excess microlens resist material is removed leaving the appropriate amount of microlens resist to form a microlens. Typically, the structures remaining have an approximately square form. The square form is fixed using deep ultraviolet exposure, otherwise known as post-patterning flood exposure in block 520. The deep UV exposure causes cross-linking in the resist improving the transparency of the microlens resist material.

The shape of the microlens after post-patterning flood exposure is still a square form. In block 524, the microlens array is baked at a high temperature to cause the microlens resist to flow and form the desired curved shape. In one implementation of the invention, the microlens array is heated to a temperature of approximately 150° C. for a predetermined period of time (e.g., approximately two minutes).

Blocks 508 through 524 are repeated for each different colored microlens to be deposited on a planarized surface. Thus if a red, green and blue microlens are to be formed on the planarized surface, three iterations of the operations set forth in blocks 508 through 524 are typically required, one iteration for the red microlens, a second iteration for the green microlens and a third iteration for the blue microlens. When in block 528, it is determined that the last microlens has been formed on the planarized surface, an optional silylating layer is formed over the microlenses in block 532.

Typically, the microlens array, formed in accordance with block 504 through 524, is a polymeric lens array and is formed from photoresists. However, prior to silylation, these polymeric microlenses formed from photo resists lack the mechanical, thermal and environmental stability required for most devices. Thus, in this embodiment, the surface of the microlens array is silicated through silylation of the microlens resist. This silicated process is known to stabilize the resist and is described in literature such as *Introduction to Microlithography* edited by L. Thompson, C. Grant Wilson, and M. J. Bowden published by *The American Chemical Society* copyrighted 1994. On pages 243 to 244.

In one embodiment of the invention, the silylated microlens are further subject to deep ultraviolet bleaching. In the bleaching process, the microlens array is exposed to Deep (DUV) radiation of approximately 200–300 nanometers and intensity of 500 milliWatts/centimeter$^2$ wavelength for a period of one minute time such as that which occurs in Fusion DUV systems. The UV bleaching changes the light transmittance characteristics of the color microlenses. Bleaching reduces the tendency of the microlenses to have a yellowish tint.

In block 540, the silylated color microlens surface is converted to a silicated surface using an oxygen reactive ion treatment (RIE). A silicated surface is preferred to the salyated surface because the silicated surface is stiffer, more stable and resistant to deformation. In order to convert the salyated surface to a silicated surface, the salyated microlens surface is exposed to an oxygen reactive ion etch for approximately 30 seconds. The RIE etch power should be low enough such that it does not cause significant etching. A typical RIE etch power may be approximately 60 watts.

Figure 6A:
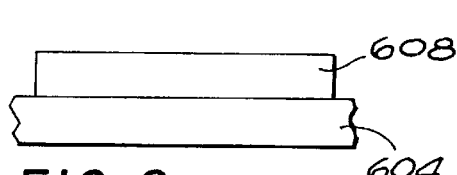
FIGS. 6A through 6E show the cross-section of a microlens system after key processing operations.
Figure 6B:
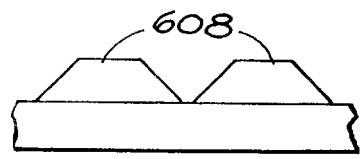
Figure 6C:
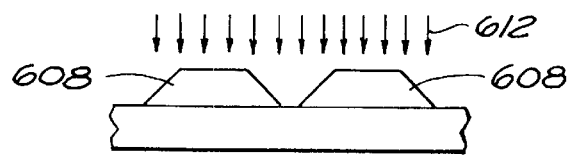
Figure 6D:
Figure 6E:
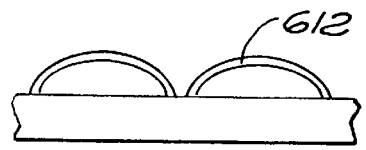

FIGS. 6A through 6D illustrate cross sections of the microlens structure at various stages in the processing described in FIG. 5. In FIG. 6A, the planarized surface 604 is shown with a deposited layer of color microlens resist 608. FIG. 6B illustrates the "square" form of the remaining microlens resist 608 after the patterning block described in block 516. FIG. 6C illustrates the patterned microlens resist during exposure to DUV radiation 612. In order to round angular edges, the color microlens resist is subject to a thermal flow or cross link baking process described in block 524 of FIG. 5 to produce a curved microlens 608 as illustrated in FIG. 6D. The color microlens resist, which now forms a color microlens of FIG. 6D, is subject to silylated, DUV bleaching and RIE to produce the coated microlens structure 612 illustrated in FIG. 6E.

While certain exemplary embodiments have been described in detail and shown in the accompanying drawings and description, it is to be understood that such embodiments are merely illustrative and not restrictive on the broad invention. This invention is not to be limited to the specific arrangement and constructions shown and described; since various other modifications may occur to those of ordinary skill in the art.

What is claimed is:

1. A method of forming a color microlens array on a semiconductror structure comprising:

depositing a first colored microlens resist on a semiconductor surface over a plurality of pixel regions in a color display layer;

patterning the first colored microlens resist;

baking the first colored microlens resist to cause flowing of the first colored microlens resist resulting in at least one microlens with a curved suface directly above one of the plurality of pixel regions; and, repeating the depositing, patterning and baking operations on said semiconductor structure using a second colored microlens resist, said second microlens resist filtering a different color than said first colored microlens resist.

2. The method of claim 1 further comprising:

fixing the first colored microlens resist by deep ultraviolet exposure to cause cross-linking in the microlens resist after the patterning of the colored microlens resist.

3. The method of claim 1 further comprising:

stabilizing the microlens suface using silylation of a surface of the first colored microlens.

4. The method of claim 1 further comprising:

exposing at least one microlens to a deep ultra-violet bleaching to improve transparency.

5. The method of claim 1 wherein the depositing, patterning, and baking operations are repeated three times, each time corresponding to a different colored polymer resist.

6. The method of claim 1 wherein the patterning operation is performed using a photolithographic process.

7. The method of claim 1 wherein the plurality of pixel regions are part of a liquid crystal display layer.

* * * * *

UNITED STATES PATENT AND TRADEMARK OFFICE
CERTIFICATE OF CORRECTION

PATENT NO. : 6,433,844 B2
DATED : August 13, 2002
INVENTOR(S) : Li.

It is certified that error appears in the above-identified patent and that said Letters Patent is hereby corrected as shown below:

<u>Column 6,</u>
Line 32, delete "semiconductror", insert -- semiconductor --.
Line 40, delete "suface", insert -- surface --.

Signed and Sealed this

First Day of April, 2003

JAMES E. ROGAN
*Director of the United States Patent and Trademark Office*